United States Patent
Shinoura et al.

(10) Patent No.: US 6,780,055 B2
(45) Date of Patent: Aug. 24, 2004

(54) TERMINAL STRUCTURE OF HIGH FREQUENCY SIGNAL TRANSMITTING PART

(75) Inventors: Tatsuo Shinoura, Osaka (JP); Jun Shishido, Takatsuki (JP); Yuzo Okano, Takatsuki (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 10/342,115

(22) Filed: Jan. 14, 2003

(65) Prior Publication Data

US 2003/0148662 A1 Aug. 7, 2003

(30) Foreign Application Priority Data

Feb. 6, 2002 (JP) ........................................ 2002-029685

(51) Int. Cl.⁷ ............................................ H01R 13/648
(52) U.S. Cl. ...................................... 439/607; 439/108
(58) Field of Search ................................. 439/607, 609, 439/608, 108, 92, 95

(56) References Cited

U.S. PATENT DOCUMENTS 6,086,420 A * 7/2000 Wu ............................. 439/607

* cited by examiner

*Primary Examiner*—Alex Gilman
(74) *Attorney, Agent, or Firm*—Osha & May L.L.P.

(57) ABSTRACT

The present invention provides a terminal structure of a high frequency signal transmitting part which can enhance high frequency characteristics of high frequency signal transmitting terminals which are projected in the sideward direction from side faces of a casing of the high frequency signal transmitting part and are bent thereafter. In such a terminal structure, outer faces of the projected high frequency signal transmitting terminals are covered with extension portions of shielding plates in a non-contact state.

2 Claims, 11 Drawing Sheets

TERMINAL STRUCTURE OF HIGH FREQUENCY SIGNAL TRANSMITTING PART

BACKGROUND OF THE INVENTION

1. Field of the Invention

The present invention relates to a terminal structure of high frequency signal transmitting part, for example, a terminal structure which is applicable to a terminal for transmitting high frequency signals of a high frequency relay.

2. Description of the Related Art

Conventionally, as a high frequency relay which constitutes one of high frequency signal transmitting parts, there has been considered, for example, a structure which arranges a contact mechanism between two shield plates which face each other in an opposed manner in the vertical direction with a given gap therebetween. By arranging the contact mechanism between two shield plates which face each other in an opposed manner in the vertical direction, it is possible to interrupt jumping of electric waves from the outside and to prevent irradiation of electric waves to the outside thus ensuring the excellent high frequency characteristics.

Figure 11:
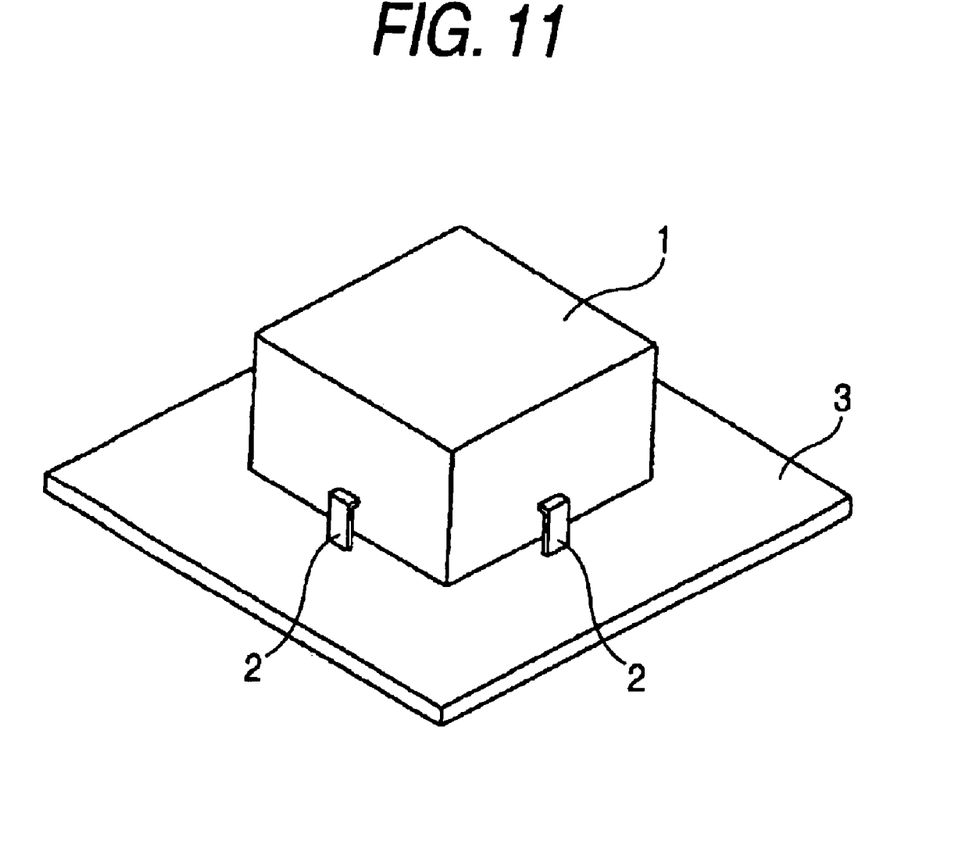
FIG. 11 is a schematic perspective view of a high frequency signal transmitting part according to a conventional example.

However, in such a high frequency relay, due to the presence of two shield plates, it is difficult to pull out terminals for transmitting high frequency signal from an upper or lower surface of a housing. Accordingly, the terminals for transmitting high frequency signal is projected in a sideward direction from a side face of the housing and is bent downwardly so as to enable an electrical connection with a printed circuit board. As a result, although the high frequency signal relay exhibits the excellent high frequency characteristics by itself, since portions of the terminals are exposed to an external space and hence, the terminals have suffered from a high frequency loss attributed to the connection structure of the terminals. For example, when a large number of high frequency relays 1 shown in FIG. 11 are mounted on a printed circuit board 3 in a concentrated manner, the portions of the exposed terminals 2 are liable to easily receive the influence of high frequency signals irradiated from other high frequency signal relays 1. Further, the high frequency signals irradiated from the exposed portions of the terminals 2 are reflected on housings of other high frequency relays 1 and jump into the portions of the terminals 2 and hence, there has been a drawback that the high frequency characteristics are degraded.

The present invention has been made in view of the above-mentioned drawbacks and it is an object of the present invention to provide a terminal structure of a high frequency signal transmitting part which can enhance the high frequency characteristics of terminals for transmitting high frequency signals which are projected in a sideward direction from side faces of a housing of the high frequency signal transmitting part and are bent thereafter.

SUMMARY OF THE INVENTION

The terminal structure of a high frequency signal transmitting part according to the present invention is directed to a terminal structure of a high frequency signal transmitting part in which a high frequency signal transmitting terminal is projected in the sideward direction from a side face of a casing and is bent, wherein an outer face of the projected high frequency signal transmitting terminal is covered with an extension portion of a shielding member in a non-contact state.

Due to such a constitution, according to the present invention, the outer face of the high frequency signal transmitting terminal can be electromagnetically shielded by the extension portion of the shielding member so that the high frequency characteristics can be enhanced.

Further, according to one embodiment of the present invention, the extension portion of the shielding member may have a width equal to or more than a width of the high frequency signal transmitting terminal.

Due to the above-mentioned embodiment, the electromagnetic shielding is performed by the extension portion of the shielding member having the wide width and hence, the high frequency characteristics are further enhanced.

According to another embodiment, a gap defined between the high frequency signal transmitting terminal which is projected from the casing in the sideward direction and the extension portion of the shielding member may be set uniform.

Due to this embodiment, the gap defined between the high frequency signal transmitting terminal and the extension portion of the shielding member can be made uniform so that the high frequency characteristics can be enhanced.

According to still another embodiment, an earth terminal may be directly extended from the extension portion of the shielding member.

Due to this embodiment, the shielding member may be mounted on a printed circuit board through the earth terminal thus providing an advantageous effect that the availability of the terminal structure of the high frequency signal transmitting part can be enhanced.

BRIEF EXPLANATION OF DRAWINGS

FIG. 7 shows a spool which constitutes the electromagnet block shown in FIG. 1, wherein

FIG. 8 is a view showing different modes of operation of the spool shown in FIG. 7, wherein

FIG. 9 is a schematic perspective view showing embodiments according to the present invention, wherein

PREFERRED EMBODIMENTS OF THE PRESENT INVENTION

Embodiments according to the present invention are explained in conjunction with attached drawings consisting of FIG. 1 to FIG. 9.

Figure 1:
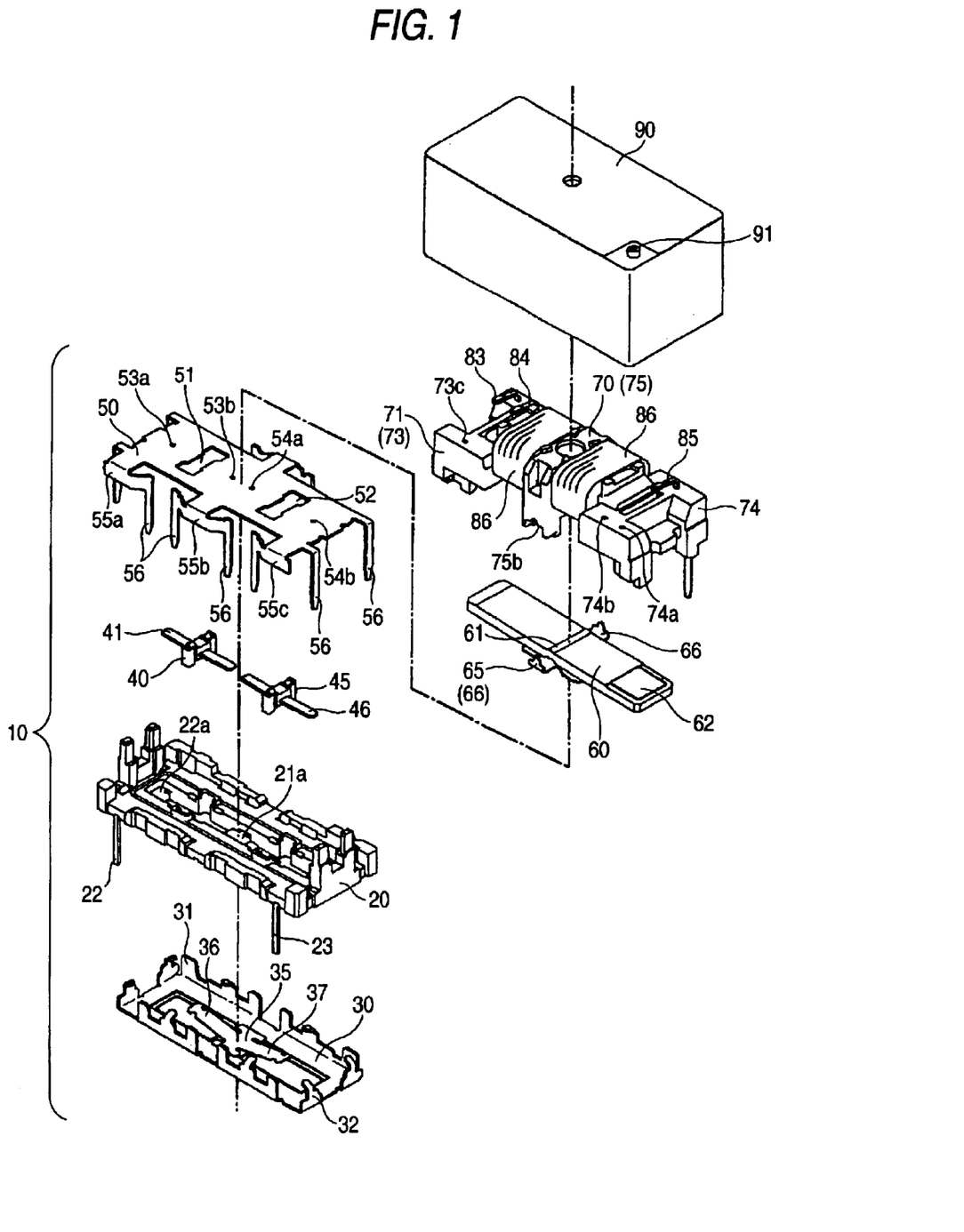
FIG. 1 is an exploded perspective view showing an electromagnetic relay to which an electromagnetic device according to the present invention is applied.

This embodiment is directed to a case in which a terminal structure of high frequency signal transmitting part is applied to an electromagnetic relay which is served for opening or closing a high frequency circuit. As shown in FIG. 1, the electromagnetic relay is substantially constituted such that an electromagnet block 70 to which a movable iron piece 60 is assembled is mounted on a base block 10 and, at the same time, the base block 10 and the electro magnet block 70 are covered with a casing 90.

Figure 3:
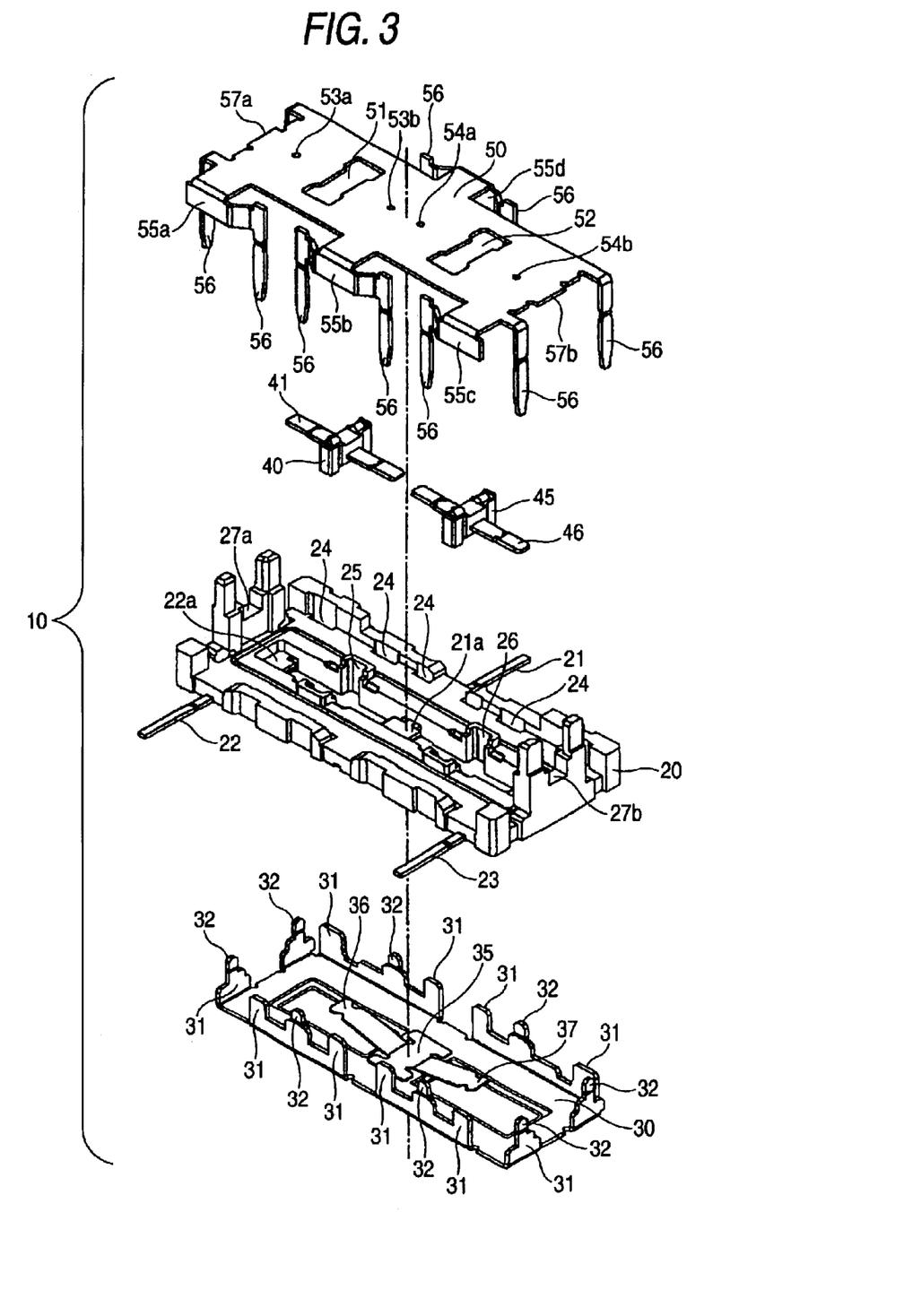
FIG. 3 is an exploded perspective view of a base block shown in FIG. 1.

As shown in FIG. 3, in the base block 10, a base 20 to which a pair of movable contact blocks 40, 45 are assembled is sandwiched by a lower shield plate 30 and an upper shield plate 50 from above and below.

The base 20 is formed such that a common fixed contact terminal 21, a normally-open fixed contact terminal 22 and a normally-closed fixed contact terminal 23 are blanked from a lead frame not shown in the drawing and, thereafter, these terminals are transported to the inside of molds and are formed by insert molding. Then, the terminals 21, 22, 23 are cut out from the lead frame by press working and are completed by bending. Here, insertion holes 24 which are served for assembling the lower shield plate 30 described later are formed in a peripheral portion of the base 20. Further, positioning recessed portions 27a, 27b are formed in both-side end faces of the base 20.

The lower shield plate 30 is formed such that a conductive plate-like member is blanked by press working and erected walls 31 are formed by raising a peripheral portion of the conductive plate-like member by bending. A suitable number of engaging tongues 32 which can be folded are formed on an upper end portion of the erected wall 31.

Further, a restoring spring 35 is integrally formed on a central portion of a bottom face of the lower shield plate 30 by welding. Both end portions 36, 37 of the restoring spring 35 are brought into pressure contact with lower end faces of movable contact blocks 40, 45 described later so as to bias movable contact pieces 41, 46 in an upward direction.

The movable contact blocks 40, 45 are formed by making the movable contact pieces 41, 46 made of a conductive leaf spring subjected to insert molding and these movable contact blocks 40, 45 are assembled to the base 20 along vertical guide grooves 25, 26 of the base 20. Accordingly, both end portions of the movable contact piece 41 are respectively brought into contact with or separated from a fixed contact portion 21a of the common fixed contact terminal 21 and a fixed contact portion 22a of the normally-open fixed contact terminal 22. Further, both end portions of the movable contact piece 46 are respectively brought into contact with or separated from the fixed contact portion 21a of the common fixed contact terminal 21 and a fixed contact portion 23a of the normally-closed fixed contact terminal 23.

Figure 4A:
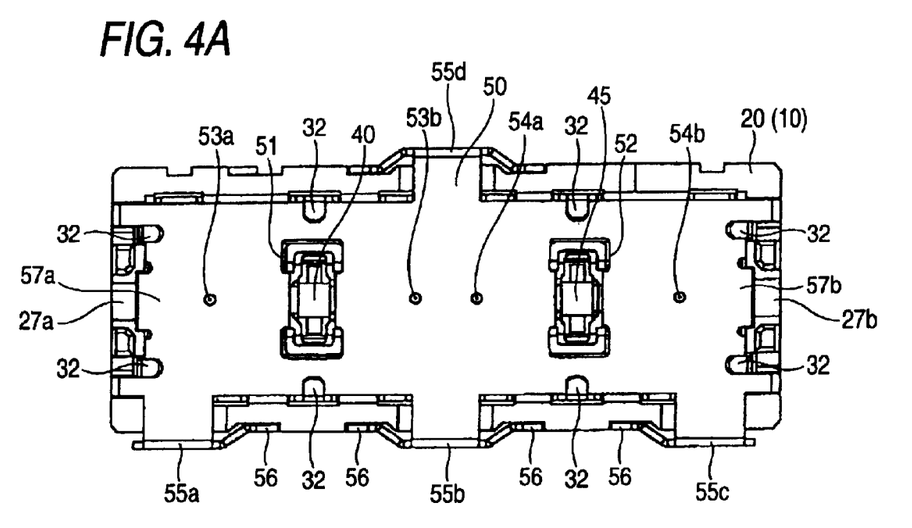
FIG. 4A is a plan view of the base block shown in FIG. 3
Figure 4B:
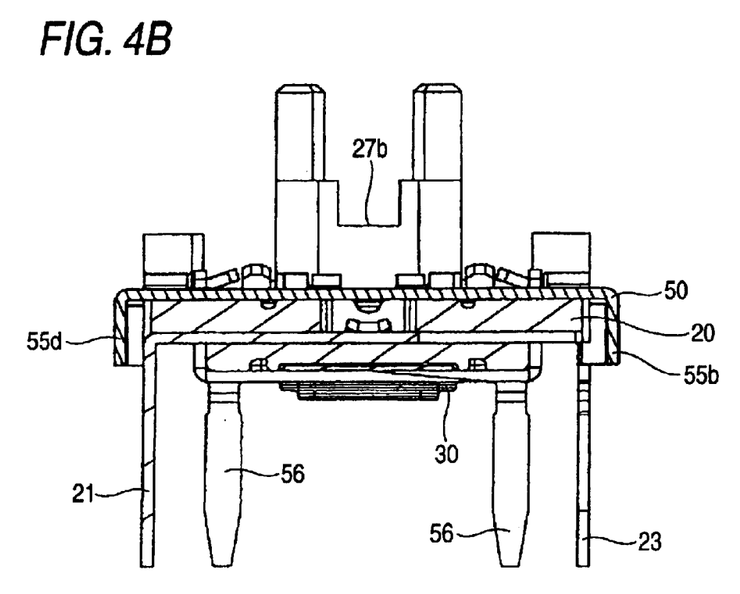
FIG. 4B is a longitudinal cross-sectional view of the base block shown in FIG. 3.
Figure 5A:
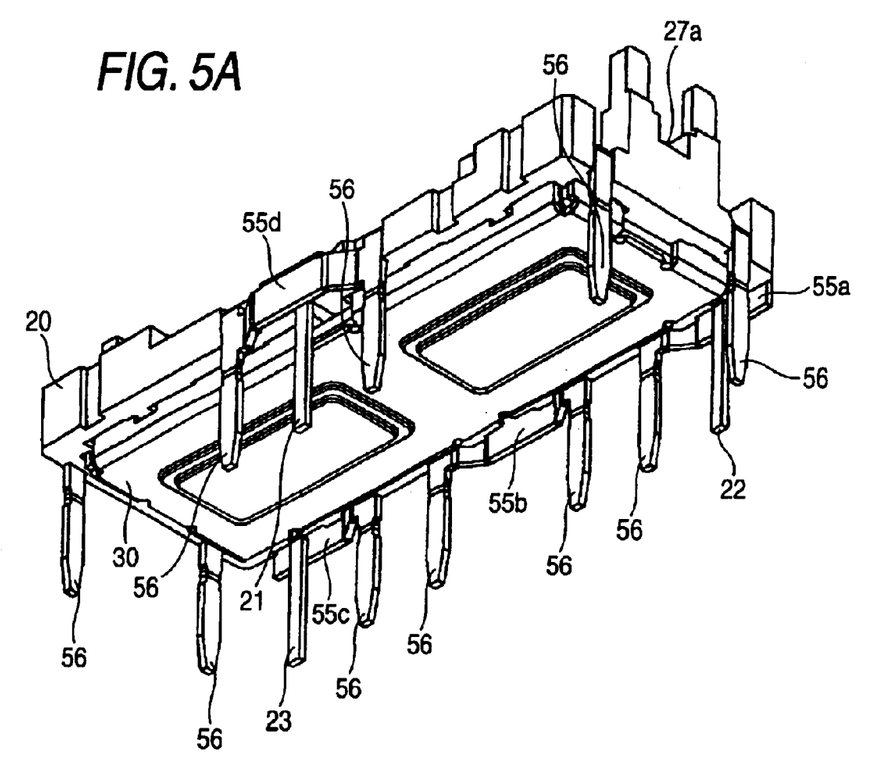
FIG. 5A is a perspective view of the base block shown in FIG. 3 as viewed from a lower side and FIG. 5B is a partially enlarged view of FIG. 5A.
Figure 5B:
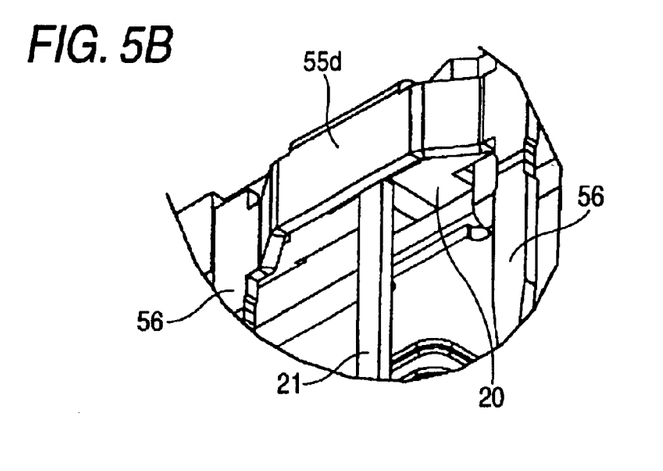

The upper shield plate 50 is formed of a rectangular plate-like conductive member, wherein the movable contact blocks 40, 45 are projected through insertion holes 51, 52 formed in two portions of the upper shield plate 50 in the longitudinal direction such that the movable contact blocks 40, 45 are movable in the vertical direction. Further, on the upper shield plate 50, earth contact portions 53a, 53b are formed by projection forming such that the earth contact portions 53a, 53b face each other in an opposed manner while sandwiching the insertion hole 51 therebetween and, at the same time, earth contact portions 54a, 54b are formed by projection forming such that the earth contact portions 54a, 54b face each other in an opposed manner while sandwiching the insertion hole 52 therebetween. Further, shielding tongues 55a, 55b, 55c, 55d are extended from peripheral end portions of the upper shield plate 50 and earth terminals 56 are respectively extended from these shielding tongues 55a, 55b, 55c, 55d. For example, as shown in FIG. 4 and FIG. 5, the shielding tongues 55a, 55b, 55c, 55d have a width wider than a width of proximal ends of the common fixed contact terminals 21 projected from the side faces of the base 20. Further, since the shielding tongue 55d covers the common fixed contact terminal 21 while ensuring a substantially uniform gap therebetween, the high frequency characteristics can be enhanced.

Further, positioning pawl portions 57a, 57b are projected from both end portions of the upper shield plate 50 in a sideward direction (FIG. 4A).

Subsequently, steps for assembling the base block 10 are explained. The erected walls 31 of the lower shield plate 30 to which the restoring spring 35 is integrally formed by welding are inserted into the insertion holes 24 of the base 20 from below. Then, the movable blocks 40, 45 are respectively assembled to the base 20 along the vertical guide grooves 25, 26 of the base 20 and are positioned in place. Then, the upper shield plate 50 is assembled to the base 20 and is positioned by respectively fitting the positioning pawl portions 57a, 57b of the upper shield plate 50 into the positioning recessed portions 27a, 27b of the base 20. Then, by bending the engaging tongues 32 of the lower shield plate 30 inwardly, the base 20 is sandwiched by the lower shield plate 30 and the upper shield plate 50. As a result, a strip line structure is formed and, at the same time, upper end portions of the movable blocks 40, 45 are projected through the insertion holes 51, 52 of the upper shield plate 50 such that the movable blocks 40, 45 can be pushed whereby the assembling of the base block 10 is completed.

Figure 6:
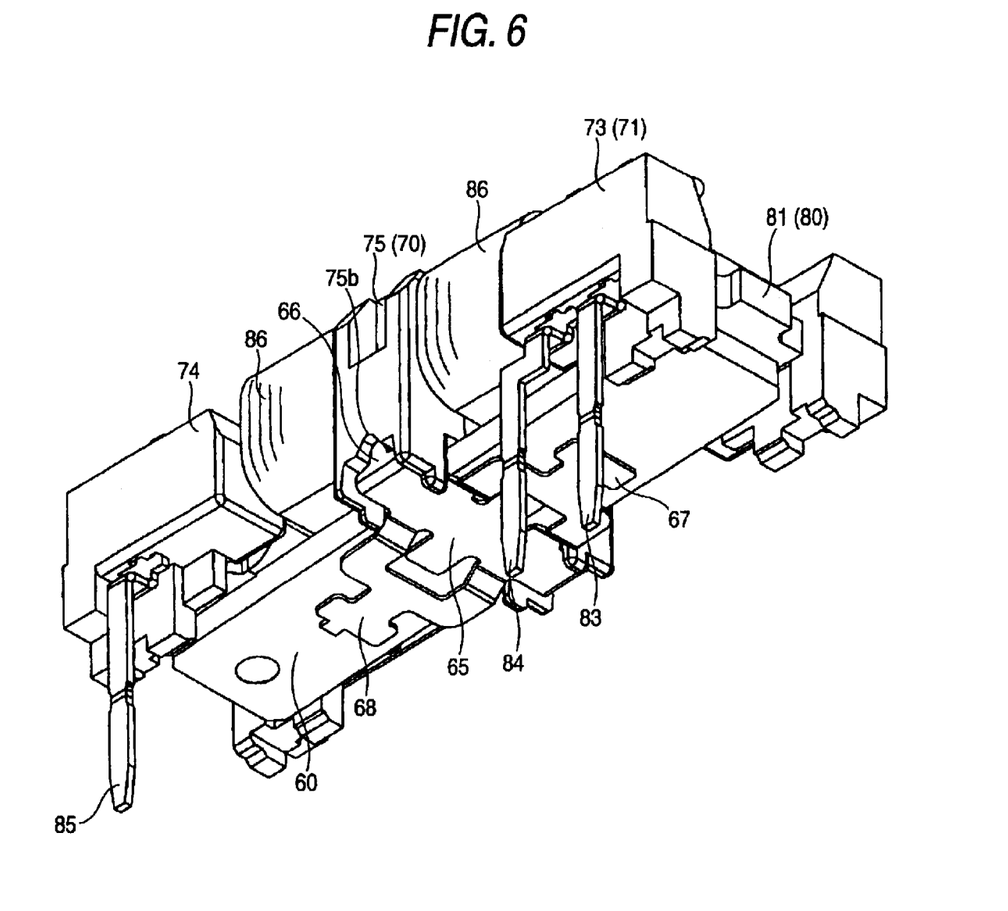
FIG. 6 is a perspective view of an electromagnet block shown in FIG. 1 as viewed from a lower side.

The movable iron piece 60 is formed of a plate-like magnetic member, wherein a projection 61 which functions as a fulcrum of rotation is formed at a center portion of the movable iron piece 60 by projection forming and, at the same time, a magnetic force shielding plate 62 is mounted on one end portion of an upper surface of the movable iron piece 60. Further, a pressing spring 65 is integrally formed on a center portion of a lower surface of the movable iron piece 60 by welding (FIG. 6).

The pressing spring 65 has an approximately cruciform shape in plane, wherein support projections 66, 66 are formed by bending and raising opposing both end portions at an approximately right angle. The support projections 66, 66 have an approximately triangular shape in a front view so as to perform centering automatically, wherein peak portions of the support projections 66, 66 are positioned on straight lines on which a peak portion of the projection 61 of the movable iron piece 60 is positioned. Accordingly, since the fulcrum of rotation of the movable iron piece 60 is aligned on the same line, it is possible to obtain an advantage that the movable iron piece 60 is smoothly rotated. Further, by applying press working to remaining opposing both end portions of the pressing spring 65, resilient arm portions 67, 68 are respectively formed (FIG. 6).

The electromagnet block 70 is constituted such that an iron core 80 and coil terminals 83, 84, 85 are assembled into a spool 71, a coil 86 is wound around the spool 71 and, thereafter, a permanent magnet 87 is assembled.

Figure 7A:
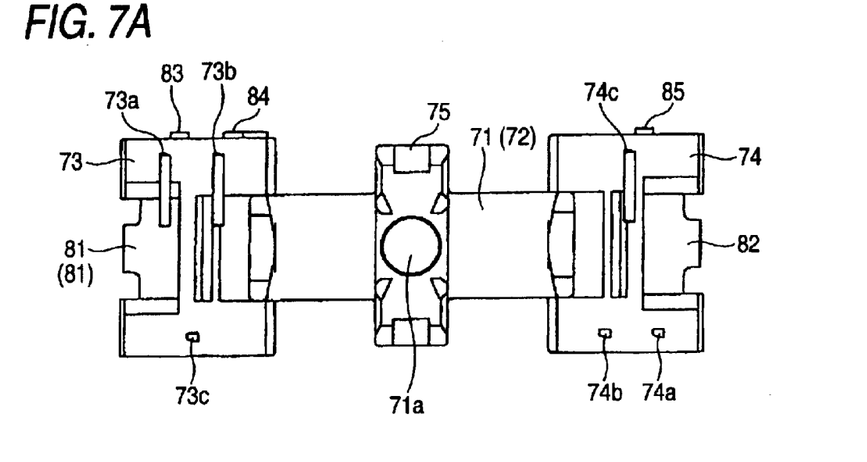
FIG. 7A is a plan view.
Figure 7B:
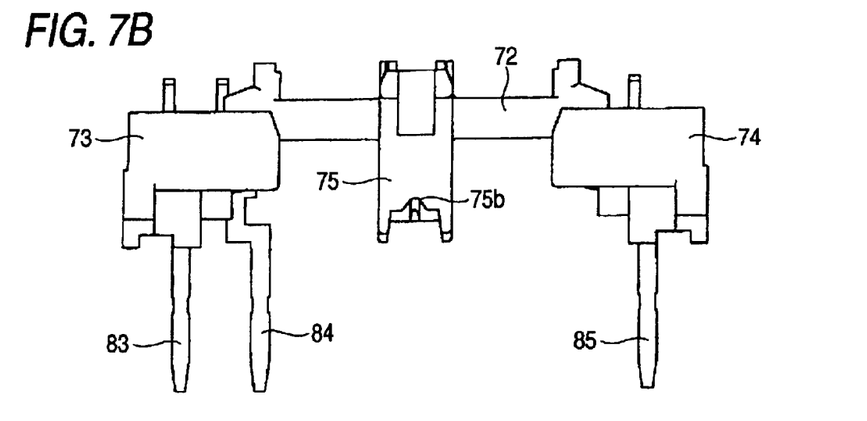
FIG. 7B is a front view and FIG. 7C is a bottom view.

That is, as shown in FIG. 7A, with respect to the spool 71, flange portions 73, 74 are respectively formed on both ends of a drum portion 72 around which the coil 86 is wound in a left-right symmetry, and a support strut 75 is integrally formed on the center of the drum portion 72 by molding. A push-insertion groove 72a into which the iron core 80 explained later is pushed into is formed on a lower face of the drum portion 72.

Figure 2:
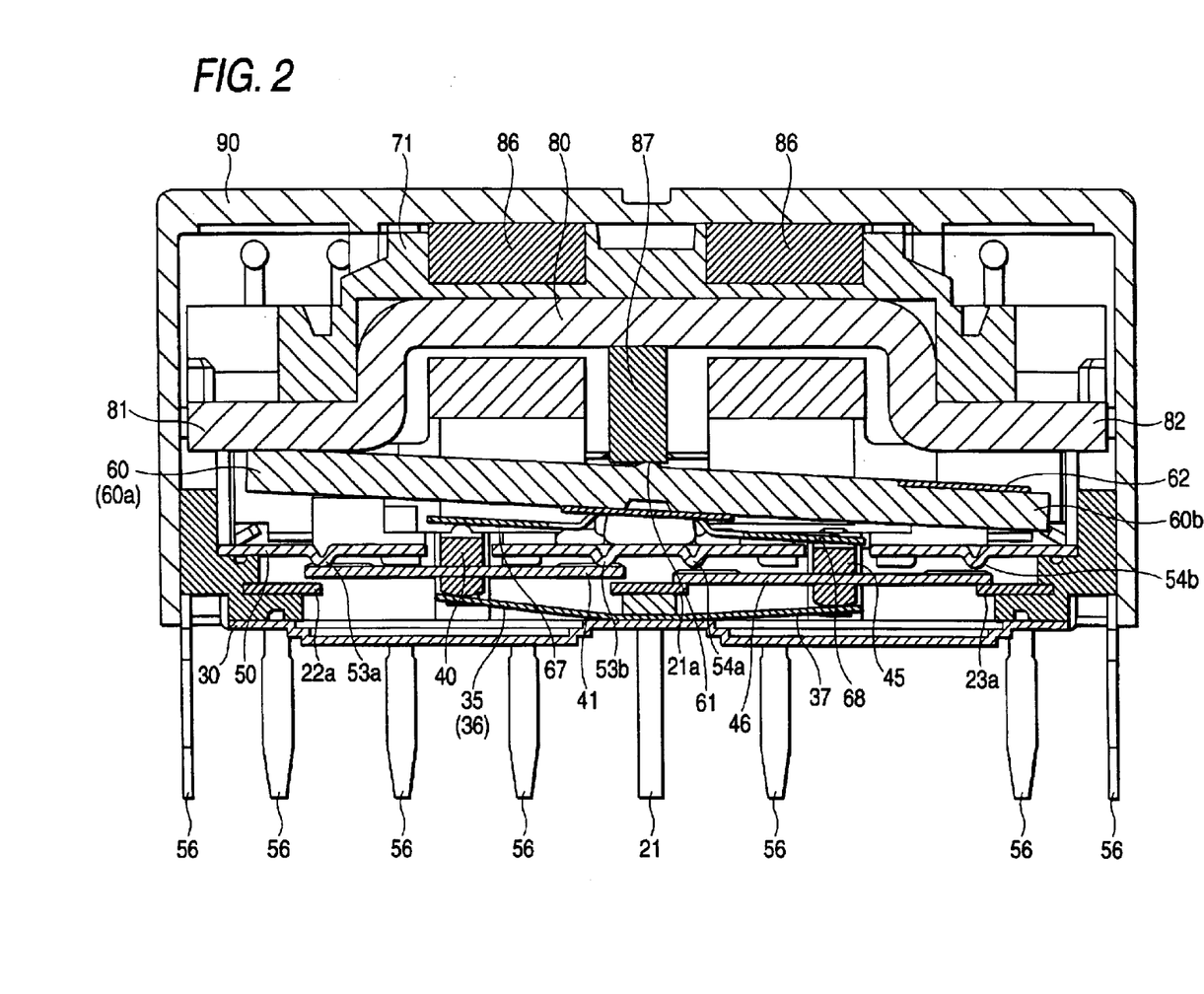
FIG. 2 is a longitudinal cross-sectional view of the electromagnetic relay shown in FIG. 1.
Figure 7C:
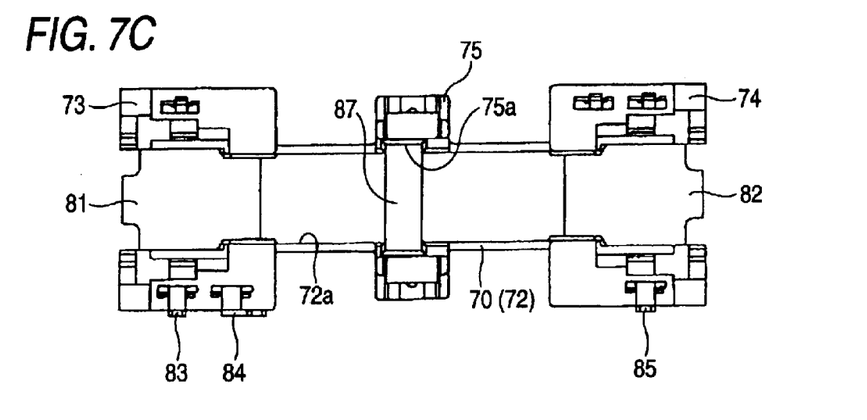

Further, coil terminal holes 73a, 73b, 73c and 74a, 74b, 74c are respectively formed on the flange portions 73 and 74 at positions where they assume a point symmetry with respect to an axis 71a which is positioned at the center of the spool 70 (FIG. 7A). Here, either one of a pair of juxtaposed coil terminal holes 73a and 73b and another pair of juxtaposed coil terminal holes 74a and 74b are provided as dummy terminals. Further, as shown in FIG. 2 and FIG. 7C, a housing recessed portion 75a is formed on a lower face of the support strut 75 such that the housing recessed portion 75a is offset to the left side of the axis 71a. Accordingly, by assembling the permanent magnet 87 having an approximately rectangular parallelepiped shape into the housing recessed portion 75a, it is possible to arrange the permanent magnet 87 at a position offset to the left side from the axis 71a. Further, a notched portions 75b into which the support projections 66 of the pressing spring 65 are fitted are formed in lower end peripheral portions of both side faces of the support strut 75.

As shown in FIG. 2, the iron core 80 has an approximately hat-shaped cross section and is assembled to the drum portion 72 of the spool 71, wherein both projecting end portions of the iron core 80 constitute magnetic pole portions 81, 82.

Accordingly, in assembling the electromagnet block 70, while pushing the iron core 80 into the push-insertion groove 72a of the spool 71, the coil terminals 83, 84 and 85 are respectively pushed into the coil terminal holes 73a, 73b and 74c of the flange portions 73 and 74. Subsequently, the coil 86 is wound around the drum portion 72 and both end portions of the coil 86 are respectively connected and soldered to upper end portions of the coil terminals 84, 85 respectively. Further, the permanent magnet 87 is assembled to the housing recessed portion 75a which is formed in the lower face of the support strut 75 of the spool 71 thus completing the electromagnet block 70. Then, the support projections 66, 66 of the pressing spring 65 are respectively fitted into the positioning notched portions 75b, 75b formed in the support strut 75 of the spool 71. Further, by having the movable iron piece 60 attracted to the permanent magnet 87, the movable iron piece 60 is assembled to the electromagnet block 70 (FIG. 6).

The casing 90 has a box-like shape which can be fitted on the base block 10 to which the electromagnet block 70 is assembled. A sealing agent is applied to a fitting face between the base block 10 and the casing 90 and the sealing agent is cured in a constant temperature bath. Subsequently, an internal air is released through a gas discharge portion 91 of the casing 90 and the assembled body is hermetically sealed by heat sealing thus completing the assembling operation of the electromagnetic relay.

According to this embodiment, the normally-open fixed contact portion 22a and the normally-closed fixed contact portion 23a are arranged at both ends of the base 20 in the longitudinal direction so that these contact portions 22a, 23a are positioned in a spaced apart manner. Further, the normally-open fixed contact terminal 22 and the normally-closed fixed contact terminal 23 are respectively projected from corner portions of one long side in the sideward direction so that these contact terminals 22 and 23 are positioned in a spaced apart manner. On the other hand, the common fixed contact terminal 21 is projected in the sideward direction from a center portion of another long side which is disposed opposite to the above-mentioned one long side and, at the same time, the coil terminals 83, 85 are respectively projected in the sideward direction of such an opposing another long side. The earth terminal 56 is arranged between respective two terminals among the normally-open fixed contact terminal 22, the normally-closed fixed contact terminal 23, the common fixed contact terminal 21 and the coil terminals 83, 85. In this manner, this embodiment has an advantage that it is possible to obtain an electromagnetic relay for opening and closing high frequency signals having the excellent isolation characteristics.

Then, the manner of operation of the electromagnetic relay having the above-mentioned constitution is explained.

As shown in FIG. 2, when a voltage is not applied to the coil 86, one end portion 60a of the movable iron piece 60 is attracted to the magnetic pole portion 81 of the iron core 80. Accordingly, the resilient arm portion 68 of the pressing spring 65 pushes down the movable contact block 45. As a result, both end portions of the movable contact piece 46 are brought into contact with the common fixed contact portion 21a and the normally-closed fixed contact portion 23a against a spring force of another end portion 37 of the restoring spring 35. On the other hand, the movable contact block 40 is biased in the upward direction due to one end portion 36 of the restoring spring 35 and hence, both end portions of the movable contact piece 41 are brought into contact with the earth contact portions 53a, 53b of the upper shield plate 50.

Then, when a voltage is applied to the coil 86 in the direction which cancels a magnetic flux of the permanent magnet 87, the magnetic pole portion 82 of the iron core 80 attracts another end portion 60b of the movable iron piece 60 so that the movable iron piece 60 is rotated using the peak portion of the projection 61 as the fulcrum of rotation. Accordingly, the resilient arm portion 67 of the pressing spring 65 pushes down the movable contact block 40 against the spring force of one end portion 36 of the restoring spring 35. As a result, the movable contact block 40 is lowered and both end portions of the movable contact piece 41 are brought into contact with the common fixed contact portion 21a and the normally-open fixed contact portion 22a. On the other hand, the movable contact block 45 is pushed upwardly due to the spring force of the other end portion 37 of the restoring spring 35. Both end portions of the movable contact piece 46 are respectively opened and separated from the common fixed contact portion 21a and the normally-closed fixed contact portion 23a and, thereafter, both end portions of the movable contact piece 46 are brought into contact with the earth contact portions 54a, 54b of the upper shielding plate 50. Thereafter, the other end portion 60b of the movable iron piece 60 is attracted to the magnetic pole portion 82 of the iron core 80 through the magnet shielding plate 62.

Further, when applying of a voltage to the coil 86 is stopped, the magnetic balance of the electromagnet device 70 is collapsed, wherein a magnetic force of the magnetic pole portion 81 of the iron core 80 is stronger than a magnetic force of the magnetic pole portion 82 of the iron core 80. Accordingly, a force that the magnetic pole portion 81 of the iron core 80 attracts one end portion 60a of the movable iron piece 60 becomes larger than a force that the magnetic pole portion 82 of the iron core 80 attracts the other end portion 60b of the movable iron piece 60 and hence, the movable iron piece 60 is rotated in a direction opposite to the above-mentioned direction. Accordingly, while the resilient arm portion 68 of the pressing spring 65 pushes down the movable contact block 45, one end portion 36 of the restoring spring 65 pushes up the movable contact block 40. As a result, while both end portions of the movable contact piece 46 are brought into contact with the common fixed contact portion 21a and the normally-closed fixed contact portion 23a, both end portions of the movable contact piece 41 are brought into contact with the earth contact portions 53a, 53b of the upper shielding plate 50 and restore the original state.

Figure 8A:
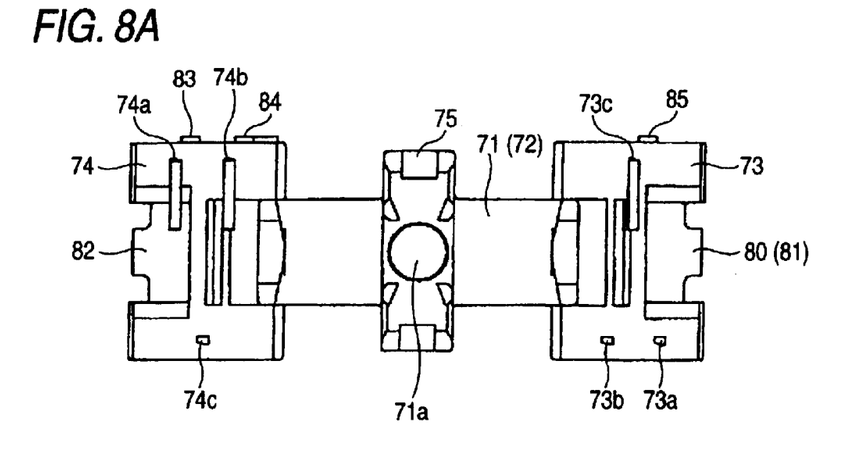
FIG. 8A is a plan view.
Figure 8B:
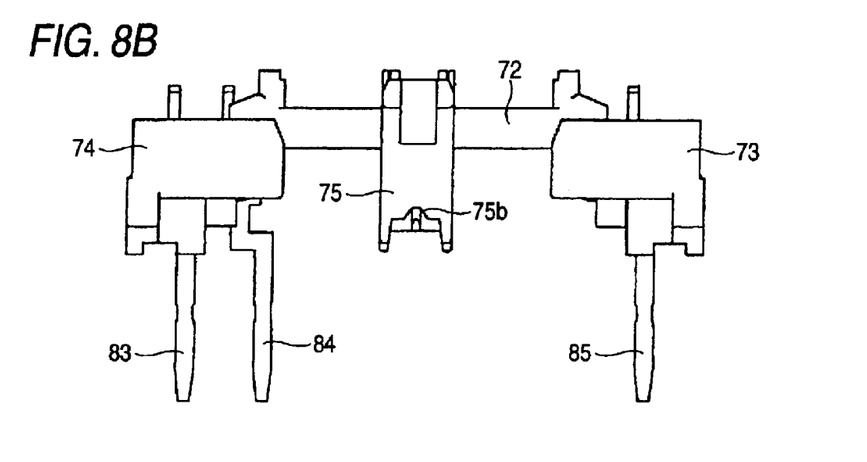
FIG. 8B is a front view and FIG. 8C is a bottom view.
Figure 8C:
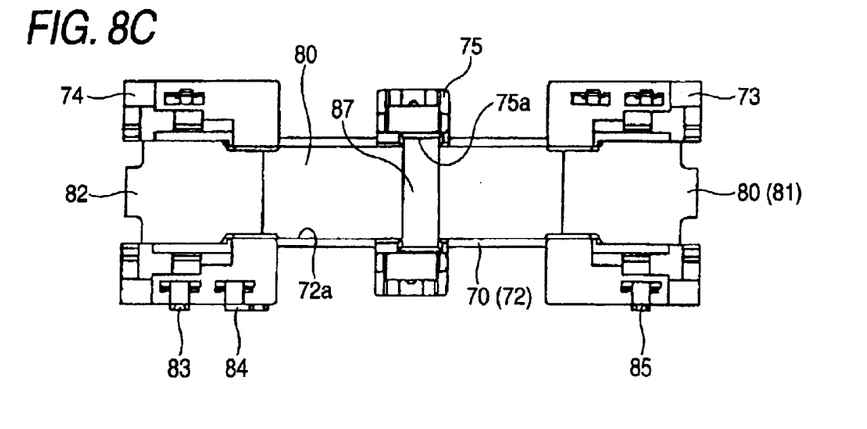

In the above-mentioned embodiment, although the normally-closed fixed contact portion 23a is opened to or closed at the movable contact block 45 which is positioned at the right side in FIG. 2, there may be a case that it is preferable to arrange the normally-closed fixed contact portion 23a at the left side in FIG. 2. In such a case, for example, as shown in FIG. 8, the coil terminals 83, 84 and 85 may be respectively inserted into the coil terminal holes 74a, 74b and 73c of the spool 71 and the mounting position of the permanent magnet 87 may be arranged at the right side of the axis 71a of the spool 71 (FIG. 8C).

According to this embodiment, it is possible to obtain the electromagnet block 70 having the different specification using the same spool 71 and hence, it is possible to manufacture the electromagnet blocks 70 having different specifications using one type of mold so that the manufacturing cost can be reduced. Further, since the number of parts to be managed can be reduced so that it is possible to obtain an advantage that the management of parts is facilitated.

Figure 9A:
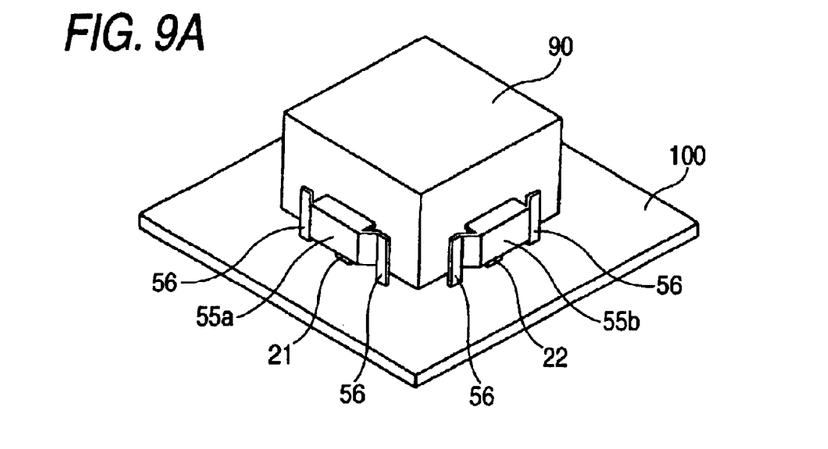
FIG. 9A is a perspective view showing the second embodiment.

FIG. 9A is a schematic perspective view of the second embodiment according to the present invention, wherein shielding tongues 55a, 55b (rear-side shielding tongue not shown in the drawing) are configured such that they are projected in the sideward direction from four side faces of a casing 90 and are bent downwardly. The shielding tongues 55a, 55b cover terminals 21, 22 (rear-side terminal not shown in the drawing) in a non-contact state. Further, earth terminals 56 which are inserted into terminal holes of a printed circuit board 100 are respectively extended from both sides of the shielding tongues 55a, 55b.

Figure 9B:
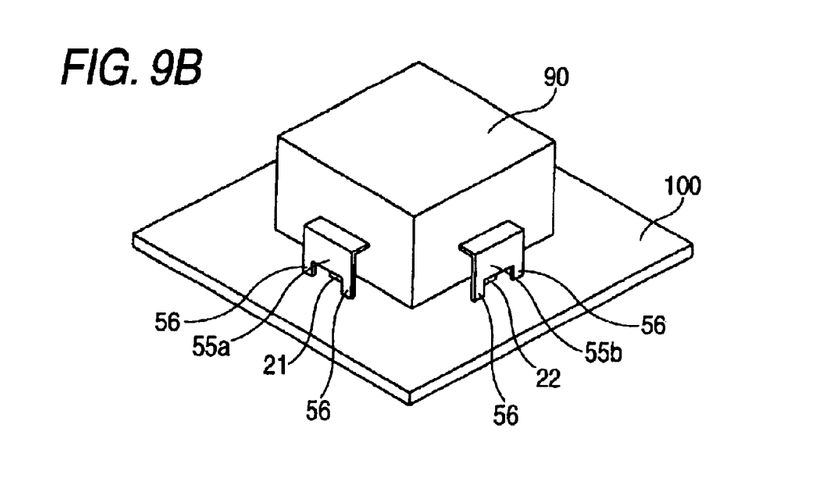
FIG. 9B is a perspective view showing the third embodiment.
Figure 9C:
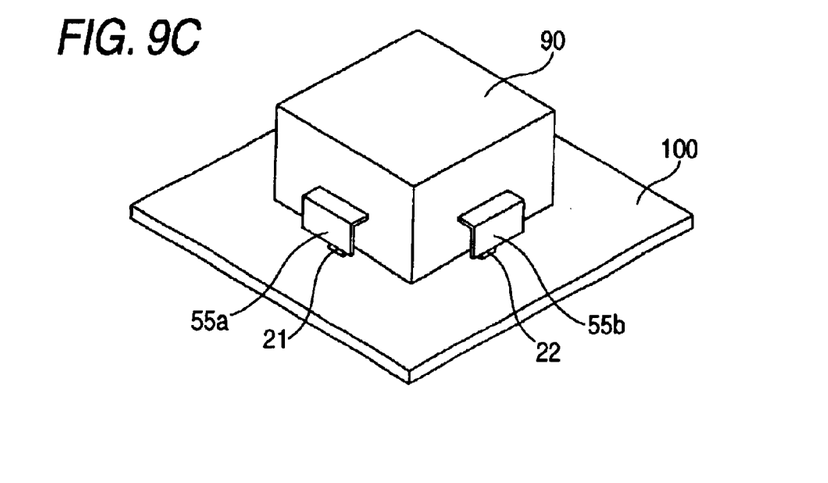
FIG. 9C is a perspective view showing the fourth embodiment.

Further, as in the case of the third embodiment shown in FIG. 9B, the earth terminals 56 may be extended downwardly from lower-side peripheral portions of the shielding tongues 55a, 55b. However, when the earth terminals are not necessary, as in the case of the fourth embodiment shown in FIG. 9C, it is unnecessary to provide earth terminals to the shielding tongues 55a, 55b.

Here, it is needless to say that the number and the position of the coil terminal holes formed in the spool can be suitably changed depending on the required conditions.

Further, as a method for collapsing the left-and-right magnetic balance, for example, shapes of the magnetic pole portions positioned at both ends of the iron core or shapes of both end portions of the movable iron piece may be made different from each other or the projection which constitutes the fulcrum of rotation of the movable iron piece may be provided at a position offset from the center of the movable iron piece.

EXAMPLE

An electromagnetic relay having the structure equal to the structure of the first embodiment is produced as an example of the present invention, and a case in which the shielding tongues 55a, 55b, 55c, 55d and the earth terminal 56 are omitted from the first embodiment is produced as a comparison example, and their high-frequency characteristics are measured. A result of measurement is shown in FIG. 10.

Figure 10:
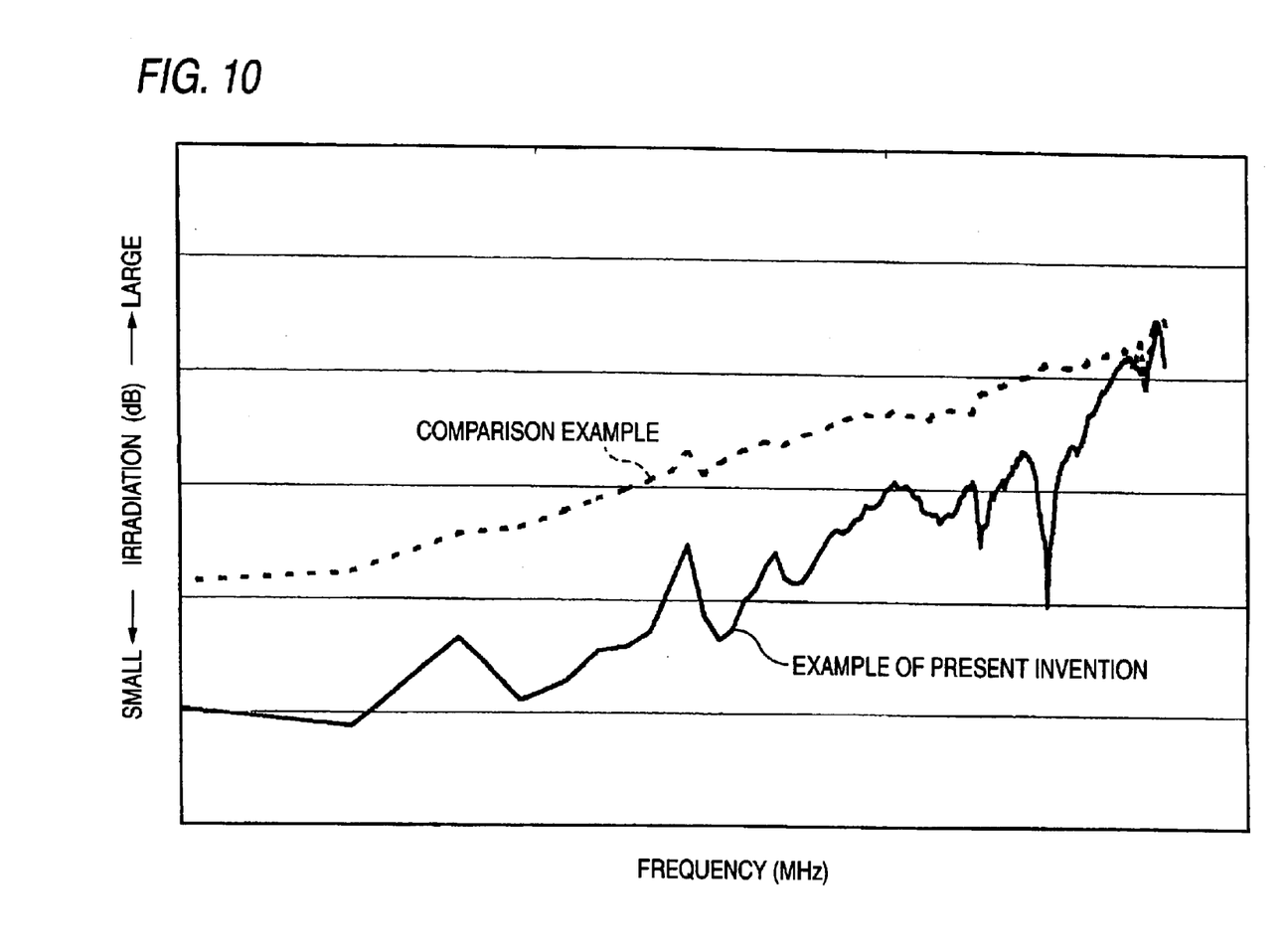
FIG. 10 is a graph showing a result of measurement of the high frequency characteristics according to the embodiment.

As can be clearly understood from FIG. 10, the example of the present invention always exhibits the smaller irradiation of high frequency than the comparison example in a range covering a low frequency band as well as a high frequency band. Particularly, in view of the fact that the irradiation of high frequency is sharply decreased in the vicinity of the measured maximum frequency, it has been found that the example of the present invention exhibits the excellent high frequency characteristics compared to the comparison example.

According to the present invention, it is possible to obtain an advantageous effect that outer faces of the high frequency transmitting terminals are electromagnetically shielded by the extension portions of the shielding members and hence, the high frequency characteristics can be enhanced.

What is claimed is:

1. An electromagnetic relay for high frequency, comprising:
   an electromagnet block having a moveable iron piece assembled in the electromagnetic block, wherein the electromagnetic block is mounted on a block base, and wherein the electromagnet block and the block base are covered by a casing;
   a shielding member having a plurality of extended portions that extend from peripheral end portions of the shielding member, wherein the shielding member is mounted above the base block; and
   a plurality of projected high frequency signal transmitting terminals, wherein the plurality of extended portions and the plurality of projected high frequency transmitting terminals correspond in number, and wherein outer faces of the plurality of projected high frequency transmitting terminals are covered by the plurality of extended portions in a non-contact state.

2. The electromagnetic relay according to claim 1, wherein an earth terminal is directly extended from the extended portion of the shielding member.

* * * * *